US 6,693,974 B2

(12) United States Patent
Jin et al.

(10) Patent No.: US 6,693,974 B2
(45) Date of Patent: *Feb. 17, 2004

(54) ADAPTIVE DIGITAL PRE-DISTORTION CIRCUIT USING ADJACENT CHANNEL POWER PROFILE AND METHOD OF OPERATION (75) Inventors: Hang Jin, Plano, TX (US); Joseph R. Cleveland, Richardson, TX (US)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/368,895

(22) Filed: Aug. 5, 1999

(65) Prior Publication Data
US 2003/0076894 A1 Apr. 24, 2003

(51) Int. Cl.[7] .............................................. H04L 25/49
(52) U.S. Cl. ...................... 375/297; 330/149; 455/114.3
(58) Field of Search ................................ 375/296, 297; 330/149, 151; 455/114.2, 114.3

(56) References Cited

U.S. PATENT DOCUMENTS

| 5,489,879 | A | * | 2/1996 | English ...................... 332/103 |
|-----------|---|---|--------|---------------------------------------|
| 5,892,397 | A | * | 4/1999 | Belcher et al. .............. 330/149 |
| 5,905,760 | A |   | 5/1999 | Schnabl et al. .............. 375/296 |
| 5,949,283 | A | * | 9/1999 | Proctor et al. ............... 370/149 |
| 6,111,462 | A | * | 8/2000 | Mucenieks et al. .......... 330/149 |
| 6,236,837 | B1 | * | 5/2001 | Midya ......................... 330/149 |
| 6,275,685 | B1 | * | 8/2001 | Wessel et al. ................ 455/126 |
| 6,449,466 | B1 | * | 9/2002 | Jin et al. ..................... 455/127 |
| 6,600,792 | B2 | * | 7/2003 | Antonio et al. .............. 375/297 |

* cited by examiner

Primary Examiner—Mohammad H. Ghayour
Assistant Examiner—Kevin M Burd (57) ABSTRACT There is disclosed a pre-distortion adjustment circuit for use in an RF transmitter that adjusts the actual adjacent channel power (ACP) noise profile of an RF power amplifier to fully use the ACP profile allowed under the applicable RF communication standard. The pre-distortion adjustment circuit pre-distorts selected components of the input signal to the RF power amplifier so that the actual output ACP profile appears similar to, if not the same as, the ACP profile under the standard. The distortion required is determined based on information extracted from the input signal, the output signal, and the standard ACP profile. The pre-distortion adjustment circuit allows significant overdrive of the RF power amplifier while maintaining the ACP noise in the RF output below the levels allowed under the standard.

20 Claims, 5 Drawing Sheets

ADAPTIVE DIGITAL PRE-DISTORTION CIRCUIT USING ADJACENT CHANNEL POWER PROFILE AND METHOD OF OPERATION

CROSS-REFERENCE TO RELATED APPLICATIONS

The present application is a related to that disclosed in co-pending U.S. patent application Ser. No. 09/224,193 for "ADAPTIVE DIGITAL PRE-DISTORTION CORRECTION CIRCUIT FOR USE IN A TRANSMITTER IN A DIGITAL COMMUNICATION SYSTEM AND METHOD OF OPERATION," filed on Dec. 30, 1998. U.S. patent application Ser. No. 09/224,193 is hereby incorporated by reference in the present disclosure as if fully set forth herein.

TECHNICAL FIELD OF THE INVENTION

The present invention is directed, in general, to wireless networks and, more specifically, to an adaptive digital pre-distortion correction circuit for use in an RF transmitter.

BACKGROUND OF THE INVENTION

Every wireless network base station has a RF power amplifier for transmitting voice and/or data signals to mobile units (i.e., cell phones, portable computers equipped with cellular modems, pagers, and the like) and a receiver for receiving voice and/or data signals from the mobile units. The design of an RF power amplifier (PA) for digital radio systems is controlled by two overriding criteria: 1) The RF power amplifier should transmit sufficient RF output power to serve the cell site of the base station in which it is installed, but should also use the minimum amount of DC power in doing so; and 2) The adjacent channel power (ACP) noise (distortion) should be under certain limits (mask), that are usually defined in a standard (i.e., ACP profile).

In most cases, these two criteria are contradictory. ACP noise results from no-linear effects, such as over-driving the power amplifier into its nonlinear region (clipping). Spurious spectral components are introduced when a signal peak is sufficiently large to saturate an RF amplifier in the transmitter. In order to meet the ACP profile, the RF transmitters in wireless networks in which digital signals have high peak-to-mean ratios, such as CDMA and multi-carrier systems, are frequently "backed off" from full power (or peak power) to avoid operating the transmitter in non-linear conditions. In these digital systems that have high peak-to-mean signal ratios, the RF power amplifier thus needs a considerable amount of power "headroom" to accommodate the peak power. For example, RF power amplifiers in some CDMA systems need more than 10 dB of headroom space to protect the peak CDMA signal power from clipping. Unfortunately, leaving this much overhead significantly reduces the power efficiency of the RF power amplifier. This increases the DC power consumption, the base transceiver station cooling requirements, the overall system volume, weight, and cost.

For a particular digital radio system, such as cellular CDMA or TDMA, the transmitter ACP profile is defined in the system standard. Generally speaking, the actual ACP profile of an RF power amplifier is not the same as the ACP profile required by the standard. The power amplifier ACP profile is determined more or less by the power amplifier device characteristics, operating modes, and signal behaviors. For example, the out-of-band spurious components generated from a CDMA signal appear like white noise: the power density does not change significantly with frequency. However, the ACP profile defined in, for example, the IS95 CDMA system standard does not require a constant spurious power density over different frequencies. The whole frequency spectrum is divided into a few blocks and the standard ACP profile changes significantly from one block to the next.

This may lead to situations in which the power amplifier output power level is dictated by the ACP noise at few frequency points where the standard ACP profile appears the most stringent. However, there may still be relatively large ACP noise margins at many other frequencies. In a sense, the power amplifier ACP noise is not optimized to make full usage of the ACP profile under the applicable standard. The excess ACP noise margin at most frequencies s not utilized.

There is therefore a need in the art for improved wireless networks that use more efficient RE power amplifiers. In particular, there is a need for improved RE power amplifiers that can operate more closely to full power in systems having high peak-to-mean digital signal ratios. More particularly, there is a need for RF power controllers that make RF power amplifiers more efficient by utilizing the available ACP noise margins under the applicable standard ACP profile.

SUMMARY OF THE INVENTION

To address the above-discussed deficiencies of the prior art, it is a primary object of the present invention to provide a pre-distortion adjustment circuit for use in an RF transmitter that optimizes the ACP profile of an RF power amplifier to fully use the ACP profile under the applicable RF communication standard. The present invention pre-distorts the RF signal so that the actual output ACP profile appears similar to, if not the same as, the ACP profile under the standard. The pre-distortion required is determined based on information extracted from the input signal, the output signal, and the standard ACP profile. Thus, the present invention allows significant overdrive of the power amplifier while still maintaining its ACP noise under the standard ACP profile.

Accordingly, in an exemplary embodiment of the present invention, there is provided, for use in an RF transmitter having an RF power amplifier required to transmit an RF output signal within selected limits of an adjacent channel power (ACP) profile specified for the RF transmitter, a pre-distortion adjustment circuit comprising: 1) input sampling means, coupled to an input of a transmit path of the RF transmitter, capable of capturing input samples from a digital input baseband signal, the input samples comprising a first input sample of amplitude X; 2) output sampling means, coupled to an output of the transmit path, capable of capturing output samples of a digital output baseband signal derived from the RF output signal, wherein a first output sample corresponds to the first input sample; and 3) processing means capable of determining from the first input sample and the first output sample a pre-distortion adjustment value capable of adjusting an amplitude of the digital input baseband signal prior to amplification by the RF power amplifier without causing the RF output signal to exceed the selected limits of the ACP profile.

According to one embodiment of the present invention, the specified limits of the ACP profile are stored in a memory associated with the processing means.

According to another embodiment of the present invention, the specified limits are specified at discrete frequency points.

According to still another embodiment of the present invention, the processing means applies the pre-distortion adjustment value to a subsequently received input sample of amplitude X.

According to yet another embodiment of the present invention, the processing means is capable of determining if the amplitude X is sufficiently small to ensure that an amplification distortion caused by the RF power amplifier is negligibly small and, in response to the determination, is capable of determining a scaling factor for the output samples.

According to a further embodiment of the present invention, the processing means scales subsequently received input samples of the digital input baseband signal according to a value of the scaling factor.

According to a still further embodiment of the present invention, the processing means adjusting an amplitude of the scaled digital input baseband signal.

According to a yet further embodiment of the present invention, the processing means modifies a selected subsequently received input sample according to a value of the scaling factor without regard to an amplitude of the selected subsequently received input sample.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
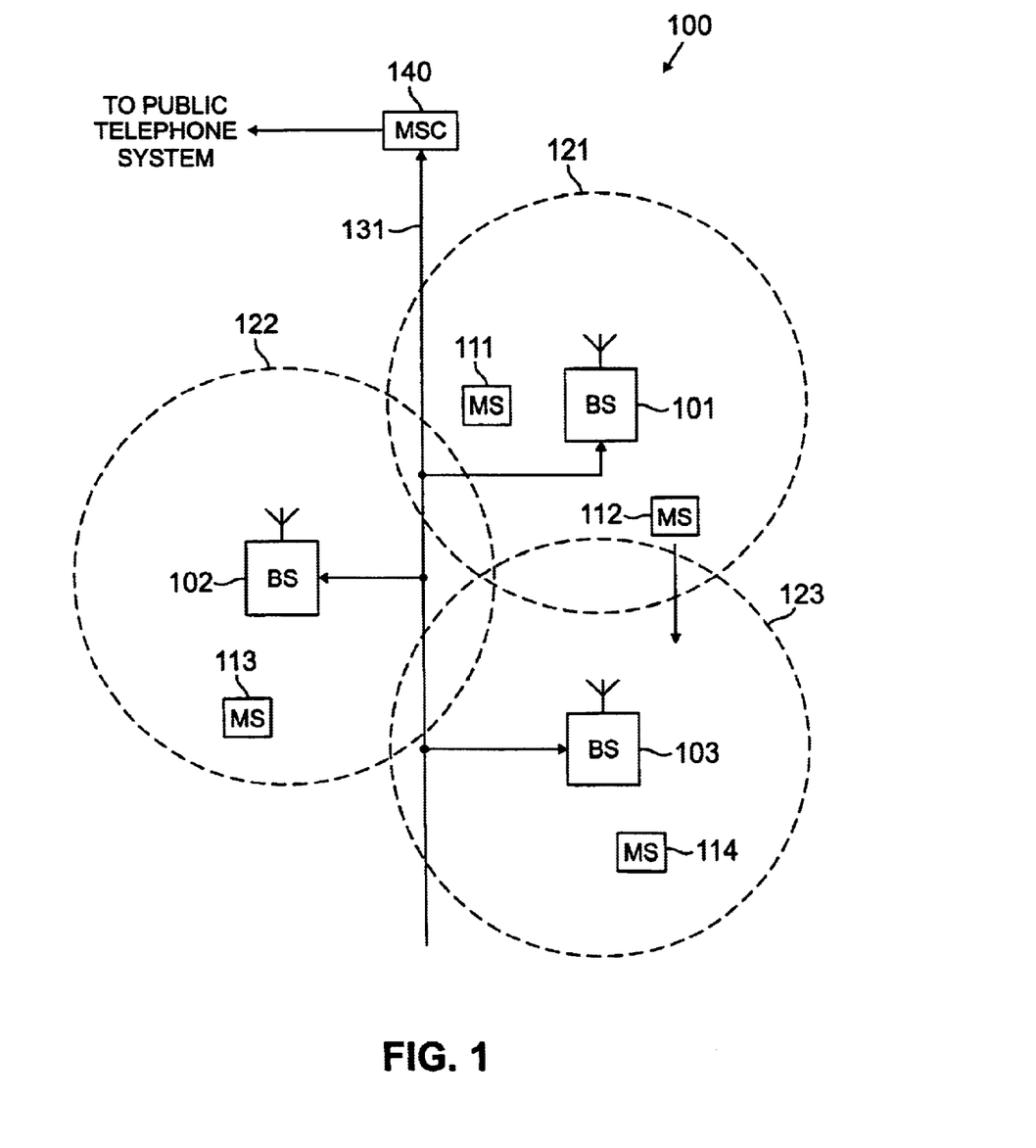
FIG. 1 illustrates an exemplary wireless network according to one embodiment of the present invention.

FIG. 1 illustrates exemplary wireless network 100 according to one embodiment of the present invention. The wireless telephone network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable cellular devices, including conventional cellular telephones, PCS handset devices, portable computers, metering devices, and the like.

Dotted lines show the approximate boundaries of the cells sites 121–123 in which base stations 101–103 are located. The cell sites are shown approximately circular for the purposes of illustration and explanation only. It should be clearly understood that the cell sites may have other irregular shapes, depending on the cell configuration selected and natural and man-made obstructions.

In one embodiment of the present invention, BS 101, BS 102, and BS 103 may comprise a base station controller (BSC) and a base transceiver station (BTS). Base station controllers and base transceiver stations are well known to those skilled in the art. A base station controller is a device that manages wireless communications resources, including the base transceiver station, for specified cells within a wireless communications network. A base transceiver station comprises the RF transceivers, antennas, and other electrical equipment located in each cell site. This equipment may include air conditioning units, heating units, electrical supplies, telephone line interfaces, and RF transmitters and RF receivers. For the purpose of simplicity and clarity in explaining the operation of the present invention, the base transceiver station in each of cells 121, 122, and 123 and the base station controller associated with each base transceiver station are collectively represented by BS 101, BS 102 and BS 103, respectively.

BS 101, BS 102 and BS 103 transfer voice and data signals between each other and the public telephone system (not shown) via communications line 131 and mobile switching center (MSC) 140. Mobile switching center 140 is well known to those skilled in the art. Mobile switching center 140 is a switching device that provides services and coordination between the subscribers in a wireless network and external networks, such as the public telephone system. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101, MS 113 is located in cell site 122 and is in communication with BS 102, and MS 114 is located in cell site 123 and is in communication with BS 103. The MS 112 is also located in cell site 121, close to the edge of cell site 123. The direction arrow proximate MS 112 indicates the movement of MS 112 towards cell site 123. At some point, as MS 112 moves into cell site 123 and out of cell site 121, a "handoff" will occur.

As is well know, the "handoff" procedure transfers control of a call from a first cell to a second cell. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
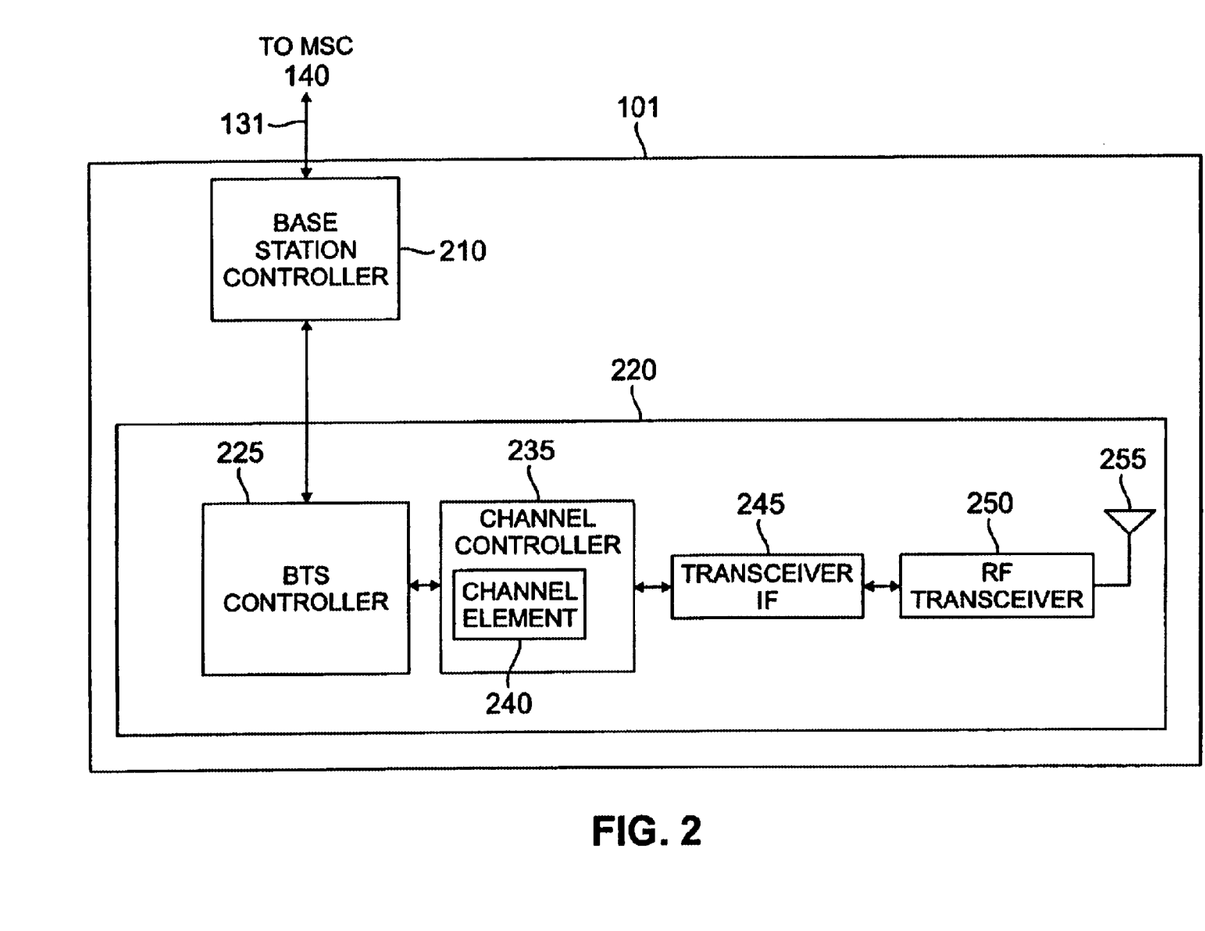
FIG. 2 illustrates in greater detail an exemplary base station in accordance with one embodiment of the present invention.

FIG. 2 illustrates in greater detail exemplary base station 101 in accordance with one embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 120 comprises BTS controller 225, channel controller 235, which contains one or more representative channel elements 240, transceiver interface (IF) 245, RF transceiver unit 250, antenna array 255, and channel monitor 260.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. Transceiver IF 245 transfers the bi-directional channel signals between channel controller 240 and RF transceiver unit 250.

Antenna array 255 transmits forward channel signals received from RF transceiver unit 250 to mobile stations in the coverage area of BS 101. Antenna array 255 also sends to transceiver 250 reverse channel signals received from mobile stations in the coverage area of BS 101. In a preferred embodiment of the present invention, antenna array 255 is multi-sector antenna, such as a three sector antenna in which each antenna sector is responsible for transmitting and receiving in a 120° arc of coverage area. Additionally, transceiver 250 may contain an antenna selection unit to select among different antennas in antenna array 255 during both transmit and receive operations. In one embodiment of the present invention, antenna array 255 may comprise an adaptive antenna array or "smart" antenna array.

To increase the efficiency of the RF transmitters in RF transceiver 250, the present invention implements an adaptive digital pre-distorter (ADPD) circuit that samples the RF transmitter input and output signals, and synchronizes and compares the samples to each other and to the ACP profile of an applicable standard. The present invention then determines the pre-distortion adjustment required to overdrive the power amplifier, while maintaining ACP noise below the ACP profile of the standard. The pre-distortion adjustment is then added to subsequent input samples. The present invention may be implemented in any type of digital modulation scheme, including TDMA, CDMA, GSM, NCDMA, multi-carrier signals, and even modems.

Figure 3:
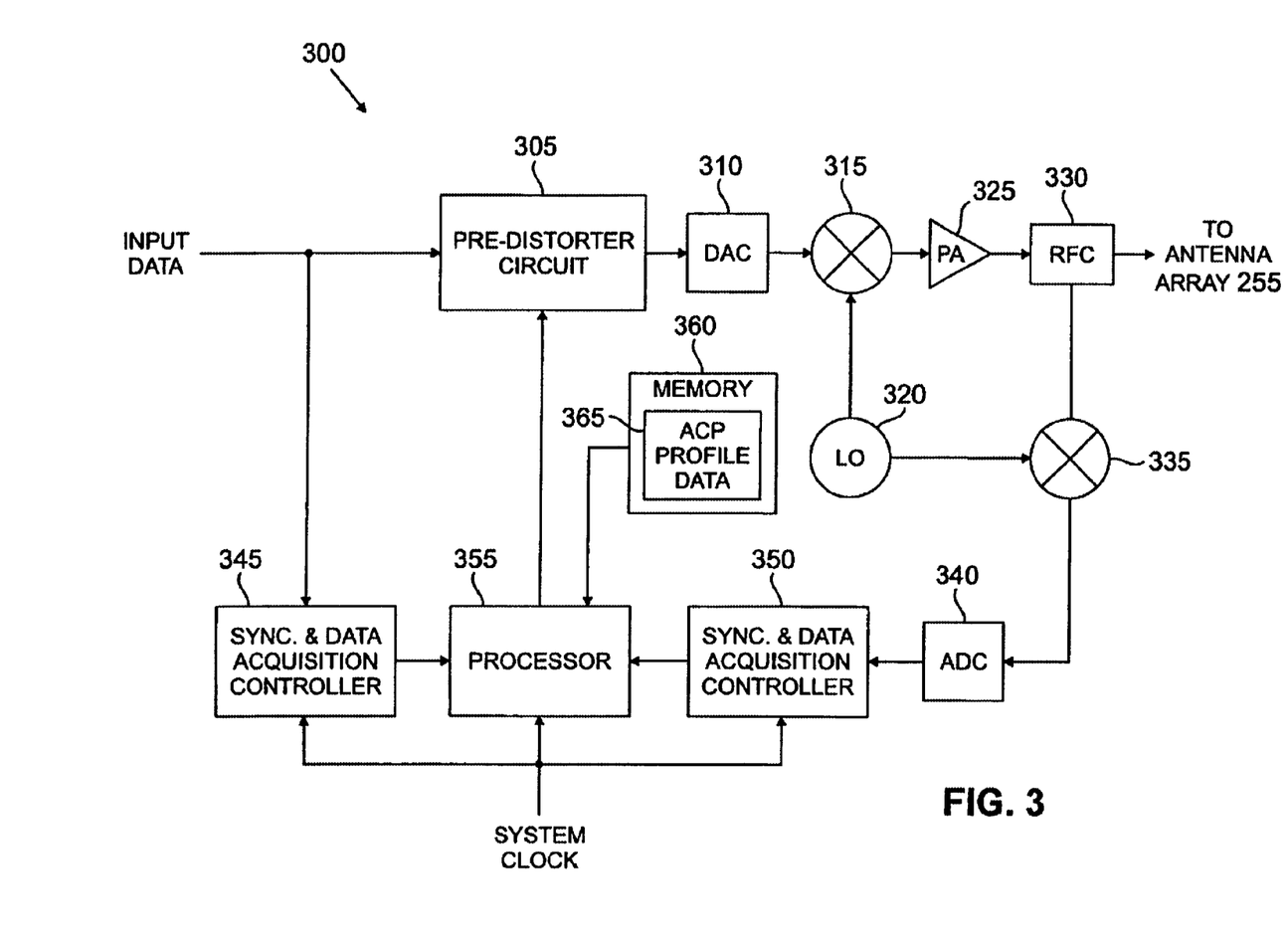
FIG. 3 illustrates an exemplary RF transmitter for use in the RF transceiver unit in FIG. 2 in accordance with one embodiment of the present invention.

FIG. 3 illustrates exemplary RF transmitter 300 for use in RF transceiver unit 250 in accordance with one embodiment of the present invention. RF transmitter 300 contains a transmit path that receives input data and generates an RF output signal that is sent to antenna array 255. The transmit path elements in RF transmitter 300 comprise pre-distorter circuit 305, digital-to-analog converter (DAC) 310, RF modulator 315, local oscillator 320, RF power amplifier (PA) 325, and RF coupler (RFC) 330.

RF transmitter 300 also contains a pre-distortion adjustment feedback loop that samples the input data signal and a corresponding part of the RF output signal, compares the samples to each other and to the accepted ACP profile, and generates a pre-distortion adjustment signal that is added to subsequent samples of the input signal data. The pre-distortion correction feedback loop elements in RF transmitter 300 comprise RF demodulator 335, local oscillator 320, analog-to-digital converter (ADC) 340, input synchronization and data acquisition controller 345, output synchronization and data acquisition controller 350, processor 355, and memory 360, which stores ACP profile data 365. The ACP profile data 365 varies according to the communications standard to which wireless network 101 must conform. For example, the ACP profile data 365 may comprise the ACP noise limitations (ACP "mask") under the IS95 CDMA system standard.

A digital baseband signal, referred to as "INPUT DATA" in FIG. 3, is received by pre-distorter circuit 305, which may optionally add a pre-distortion error correction retrieved from LUT 306 before sending the INPUT DATA signal to DAC 310. DAC 310 converts the digital signal to an analog signal that forms the baseband input to RF modulator 315. The other input to RF modulator is a reference RF carrier signal from local oscillator 320. The output of RF modulator 315 is an RF signal modulated by the baseband signal. Next, the modulated RF signal is amplified by RF power amplifier 325 to a power level suitable for transmission. The amplified modulated RF output signal is then sent to antenna array 255 via RFC 330.

Those skilled in the art will recognize that the above-described modulation and amplification steps are common operations in conventional RF transmitters. If the amplitude of the INPUT DATA signal is relatively low, RF power amplifier 325 operates well within the linear region and little or no distortion is introduced in the RF output signal sent to antenna array 255. However, when operating in the linear region, RF power amplifier 325 is very inefficient in terms of power consumption.

As the amplitude of the INPUT DATA signal rises, RF power amplifier 325 begins to saturate (i.e., operates in a non-linear manner) and distortion is introduced in the RF output signal sent to antenna array 255. This distortion includes adjacent channel power (ACP) noise that must be limited, at the frequencies of interest, to an amount less than the ACP profile (i.e., "mask") specified in the applicable system standard.

The pre-distortion adjustment signal is determined by the operation of input synchronization and data acquisition controller 345, output synchronization and data acquisition controller 350 and processor 355. RFC 330 sends a copy of the RF output signal to RF demodulator 335. The other input to RF demodulator 335 is the same carrier reference signal from local oscillator 320 that was used by RF modulator 315 to produce the original RF modulated signal. The output of RF demodulator 335 is a scaled version of the original analog baseband signal generated by DAC 310, plus possible distortion components. The scaled, distorted analog baseband is converted by ADC 340 to digital values that are read by output synchronization and data acquisition controller 350.

Figure 4:
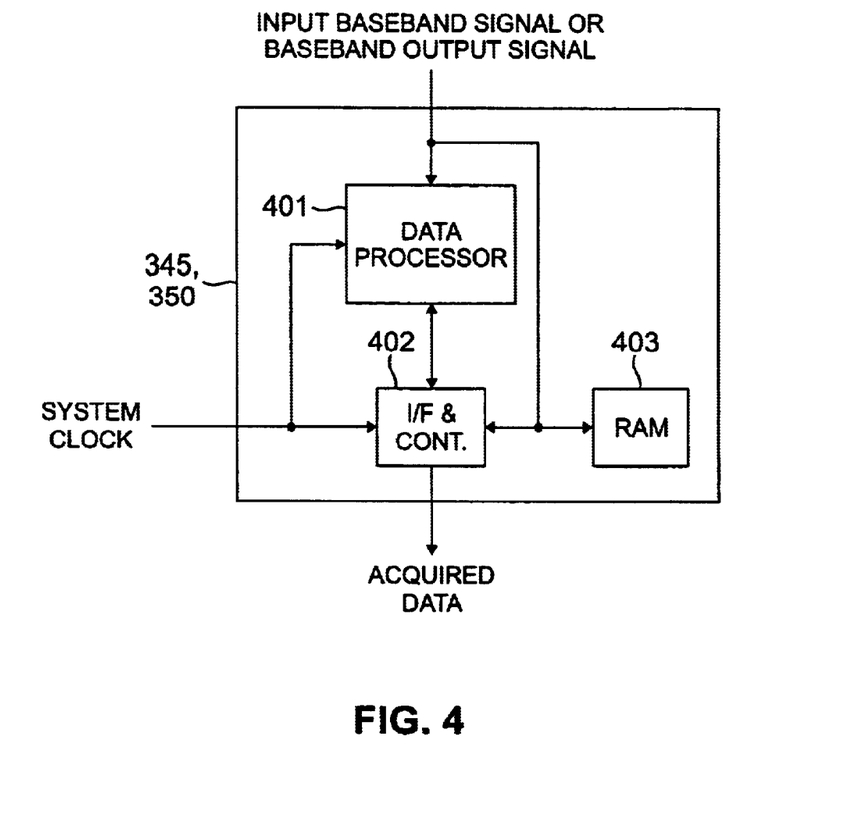
FIG. 4 illustrates exemplary input and output synchronization and data acquisition controllers in accordance with one embodiment of the present invention.

FIG. 4 illustrates exemplary input synchronization and data acquisition controller (ISDAC) 345 and output synchronization and data acquisition controller (OSDAC) 350 in accordance with one embodiment of the present invention. The operations of ISDAC 345 and OSDAC 350 are quite similar, as explained below in greater detail.

ISDAC 345 comprises data processor 401, interface (I/F) and control circuit 402, and RAM 403. A system clock provides a reference for clocking the input digital baseband signal (i.e., INPUT DATA) into data processor 401 and clocking the acquired data out of interface and control circuit 402. The INPUT DATA signal samples are stored in RAM 403. Data processor 401 comprises a signal correlator that analyzes the bits in the INPUT DATA signal to determine the start and stop of N-bit data samples, where "N" is a known system parameter that varies depending on the type of system wireless network 100 is (i.e., CDMA, GSM, TDMA, WCDMA, etc.). The N-bit samples begin with a recognizable marker that denotes the start of the N-bit sample. When an entire N-bit sample has been detected and captured (acquired), data processor 401 sends a signal to interface and control circuit 402 which transfers the acquired data to processor 355.

Similarly, OSDAC 350 comprises data processor 401, interface (I/F) and control circuit 402, and RAM 403. A system clock provides a reference for clocking the distorted output digital baseband signal into data processor 401 and clocking the acquired data out of interface and control circuit 402. The output digital baseband signal samples are stored in RAM 403. Data processor 401 comprises a signal correlator that analyzes the bits in the distorted output digital baseband signal to determine the start and stop of the N-bit data samples. The N-bit samples are the same N-bit samples that are contained in the INPUT DATA signal. Even though the output digital baseband signal may be distorted, enough of the bits remain unchanged to enable the signal correlator in data processor 401 to recognize the marker that denotes the start of the N-bit sample. When an entire N-bit sample has been detected and captured (acquired), data processor 401 sends a signal to interface and control circuit 402 which transfers the acquired data to processor 355.

Processor 355 comprises comparison circuitry for comparing the acquired data received from ISDAC 345 and OSDAC 350 with each other and with ACP profile data 365 stored in memory 360 and for calculating a pre-distortion adjustment value that is used by pre-distorter circuit 305.

ACP profile data 365 specifies the required ACP mask at a set of discrete frequency points, $A_s(z)$. Its time domain counterpart, $\{a_s(n), n=1,2,3,\ldots\}$, can be obtained by using a fast Fourier transform (FFT):

$$a_s(n) = FFT^{-1}(A_s(z)). \qquad \text{Equation 1:}$$

Pre-distorter circuit 305 comprises a series combination of: 1) a nonlinear distorter, and 2) a post digital filter. The nonlinear distorter is characterized by its transfer function $f_1(\ldots)$. If INPUT DATA samples are defined as $\{a_0(n), n=1,2,3,\ldots\}$, then $f_1(\ldots)$ is defined by the nonlinear output-input relationship:

$$a_1(n) = f_1(a_0(n)); \; n=1,2,3,\ldots \qquad \text{Equation 2:}$$

The transfer function $f_1(\ldots)$ of the nonlinear distorter can be written in a generic function form that contains adjustable parameters $\{d_i\}$, $i=1,2,3,\ldots$. The transfer function $f_1(\ldots)$ is then denoted as $f_1\{d_i\}$. The Z-domain, $A_1(z)$, of $a_1(n)$ is given by:

$$A_1(z) = FFT(a_1(n)) \qquad \text{Equation 3:}$$

The output of the non-linear distorter is received by the post digital filter portion of pre-distorter circuit 305, and is characterized by its transfer function $F_2$. The output $A_2(z)$ of the post digital filter is related to the input $A_1(z)$ received from the non-linear distorter by:

$$A_2(z) = A_1(z) \cdot F_2(z) \qquad \text{Equation 4:}$$

$F_2(\ldots)$ can be written in a generic function form with adjustable parameters $\{fi\}$, $i=1,2,3,\ldots$, denoted as $F_2\{fi\}$.

By using an inverse FFT, the output of the post digital filter (and pre-distorter circuit 305) is given by:

$$a_2(n) = FFT^{-1}(A_2(z)) \qquad \text{Equation 5:}$$

The output, $a_2(n)$, of pre-distorter circuit 305 is received by RF power amplifier 325 (after conversion in DAC 310 and modulation in RF modulator 315). RF power amplifier 325 can be modeled as a nonlinear device and characterized by a nonlinear function, $f_p$, as follows:

$$a_p(n) = f_p(a_2(n)); \; n=1,2,3,\ldots \qquad \text{Equation 6:}$$

The value $a_p$ is the output signal of RF power amplifier 325 and the value $a_2$ is its input signal. The nonlinear function, $f_p$, can be written in a generic function form that contains a set of adjustable parameters $\{p_i\}$, $i=1,2,3,\ldots$. Function $f_p$ is then denoted as $f_p\{p_i\}$. The parameter $\{p_i\}$ can be obtained from the measured input signal $a_0(n)$ and output signal $a_p(n)$ using Equations 3 through Equation 6 if the parameters $\{d_i\}$ of the distorter and $\{f_i\}$ of the post digital filter are given.

Equation 6 can also be written in its inverse form:

$$a_2(n) = f'_p(a_p(n)). \qquad \text{Equation 7:}$$

where $f'_p(\ldots)$ is the inverse function of $f_p(\ldots)$.

The data processing procedure used to determine the distortion adjustment parameter may be summarized as follows:

1) For given input data, $a_0(n)$, and given output data, $a_p(n)$, processor 355 calculates the scaling value, k. Assuming signals with low magnitude experience no distortion, the scaling value k can be obtained by comparing signals with low magnitudes.

2) Next, processor 355 multiply the value $a_p(n)$ by the scaling value k: $k \ast a_p(n) > a_p(n)$.

3) From the input $a_0(n)$, processor 355 calculates $a_1(n)$ using Equation 2 with current parameter $\{d_i\}$ for function $f_1\{d_i\}$.

4) From the value $a_1(n)$, processor 355 calculates $A_1(z)$ using Equation 3.

5) From the value $A_1(z)$, processor 355 calculates $A_2(z)$ using Equation 4 with current parameter $\{f_i\}$ for function $F_2(z)$.

6) From the value $A_2(z)$, processor 355 calculates $a_2(n)$ using Equation 5.

7) Next, processor 355 compares $a_2(n)$ with $a_p(n)$, and determines the function $f'_p(\ldots)$. The function $f'_p(\ldots)$ is the inverse function of $f_p(\ldots)$ defined in Equation 7. This provides the updated parameters $\{p_i\}$ for the function $f'_p(\ldots)$.

8) Next, processor 355 constructs the optimization function $\|a_2(n)-a_{s2}(n)\|$, where $a_{s2}(n)=f'_p(a_s(n))$. Processor 355 may use the current $\{pi\}$ or an updated value of $\{p_1\}$ for function $f'_p(\ldots)$. Optimization function $\|a_2(n)-a_{s2}(n)\|$ is a function of parameter $\{d_i\}$ and $\{f_i\}$. Processor 355 seeks new values of $\{d_1\}$ and $\{f_1\}$ at which $\|a_2(n)-a_{s2}(n)\|$ reaches a minimum value.

9) Next, processor 355 updates $\{d_i\}$ and $\{f_1\}$ in the pre-distorter circuit 305 with the new $\{d_i\}$ and $\{f_1\}$. Pre-distorter circuit 305 uses these values to adjust to adjust the received INPUT DATA signal so RF power amplifier 325 may be saturated to the point where the adjacent channel power noise is driven close to, but not over the limits allowed in the ACP profile. This increases the efficiency of RF power amplifier 325 by transmitting the RF output signal, albeit with ACP noise distortion, using a lesser amount of DC power.

10) Finally, input synchronization and data acquisition controller 345, output synchronization and data acquisition controller 350, and processor 355 start the next round of data synchronization and data acquisition.

Figure 5:
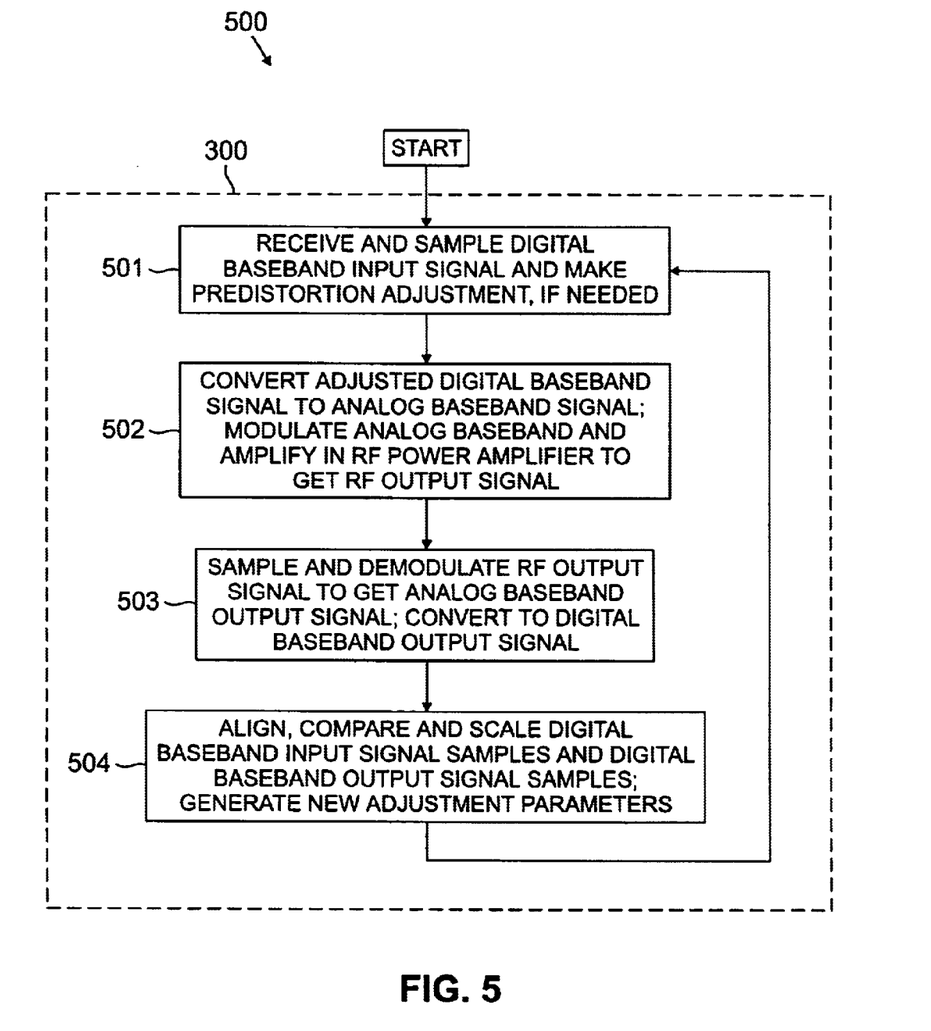
FIG. 5 is a flow diagram illustrating the operation of the exemplary RF transmitter in accordance with one embodiment of the present invention.

FIG. 5 depicts flow diagram 500, which illustrates the overall operation of RF transmitter 300 in accordance with one embodiment of the present invention. First, during routine operation, pre-distorter circuit 305 receives N-bit samples of the digital baseband input signal and makes a pre-distortion adjustment, if any (process step 501). The adjusted digital baseband signal is converted to an adjusted analog baseband signal, which is used to modulate an RF carrier signal. The modulated RF signal is then amplified in RF power amplifier 325 (process step 502).

In the pre-distortion correction loop, the RF output signal is demodulated in RF demodulator 335 to recover the analog baseband output signal. The analog baseband output signal is converted to a digital signal and sampled (process step 503). Next, the original digital baseband input signal samples are aligned with and compared to the digital baseband output signal samples. A scaling factor, k (small signal closed loop-gain), is determined (described above in greater detail) by comparing digital baseband input signals having small amplitudes with their corresponding digital baseband output signals. Also, processor 355 calculates the parameters $\{di\}$ and $\{fi\}$ and updates them in pre-distorter circuit 305 as described above (process step 504). Thereafter, the process repeats by looping back to process step 501, thereby giving the present invention its adaptive nature. The pre-distortion adjustment values are constantly updated to compensate for changes in RF transmitter 300 over time.

Although the present invention has been described in detail, those skilled in the art should understand that they can make various changes, substitutions and alterations herein without departing from the spirit and scope of the invention in its broadest form.

What is claimed is:

1. For use in an RF transmitter having an RF power amplifier required to transmit an RF output signal within specified limits of an adjacent channel power (ACP) profile specified for said RF transmitter, a pre-distortion adjustment circuit comprising:

input sampling means, coupled to an input of a transmit path of said RF transmitter, capable of capturing input samples from a digital input baseband signal, said input samples comprising a first input sample having a first amplitude;

output sampling means, coupled to an output of said transmit path, capable of capturing output samples of a digital output baseband signal derived from said RF output signal, wherein a first output sample corresponds to said first input sample; and processing means capable of receiving said input samples and said output samples and determining therefrom if out-of-band noise signals in said RF output signal are less than said specified limits of said ACP profile by a relatively large margin, wherein said processing means, in response to said determination, is further capable of increasing an amplitude of said digital input baseband signal so as to overdrive said RF power amplifier such that said out-of-band noise signals in said RF output signal are less than said specified limits of said ACP profile by a relatively small margin.

2. The pre-distortion adjustment circuit set forth in claim 1 wherein said specified limits of said ACP profile are stored in a memory associated with said processing means.

3. The pre-distortion adjustment circuit set forth in claim 2 wherein said specified limits are specified at discrete frequency points.

4. The pre-distortion adjustment circuit set forth in claim 1 wherein said processing means applies said pre-distortion adjustment value to a subsequently received input sample of said first amplitude.

5. The pre-distortion adjustment circuit set forth in claim 1 wherein said processing means is capable of determining if said first amplitude is sufficiently small to ensure that an amplification distortion caused by said RF power amplifier is negligibly small and, in response to said determination, is capable of determining a scaling factor for said output samples.

6. The pre-distortion adjustment circuit set forth in claim 5 wherein said processing means scales subsequently received input samples of said digital input baseband signal according to a value of said scaling factor.

7. The pre-distortion adjustment circuit set forth in claim 6 wherein said processing means adjusting an amplitude of said scaled digital input baseband signal.

8. The pre-distortion adjustment circuit set forth in claim 5 wherein said processing means modifies a selected subsequently received input sample according to a value of said scaling factor without regard to an amplitude of said selected subsequently received input sample.

9. A wireless network capable of communicating with a plurality of mobile stations located in a coverage area of said wireless network, said wireless network comprising:

a plurality of base stations capable of wirelessly communicating with said plurality of mobile stations, at least one of said plurality of base stations comprising an RF transmitter having an RF power amplifier required to transmit an RF output signal within specified limits of an adjacent channel power (ACP) profile specified for said RF transmitter, wherein said RF transmitter comprises a pre-distortion adjustment circuit comprising:

input sampling means, coupled to an input of a transmit path of said RF transmitter, capable of capturing input samples from a digital input baseband signal, said input samples comprising a first input sample having a first amplitude;

output sampling means, coupled to an output of said transmit path, capable of capturing output samples of a digital output baseband signal derived from said RF output signal, wherein a first output sample corresponds to said first input sample; and     processing means capable of receiving said input samples and said output samples and determining therefrom if out-of-band noise signals in said RF output signal are less than said specified limits of said ACP profile by a relatively large margin, wherein said processing means, in response to said determination, is further capable of increasing an amplitude of said digital input baseband signal so as to overdrive said RF power amplifier such that said out-of-band noise signals in said RF output signal are less than said specified limits of said ACP profile by a relatively small margin.

10. The wireless network set forth in claim 9 wherein said specified limits of said ACP profile are stored in a memory associated with said processing means.

11. The wireless network set forth in claim 10 wherein said specified limits are specified at discrete frequency points.

12. The wireless network set forth in claim 9 wherein said processing means applies said pre-distortion adjustment value to a subsequently received input sample of said first amplitude.

13. The wireless network set forth in claim 9 wherein said processing means is capable of determining if said first amplitude is sufficiently small to ensure that an amplification distortion caused by said RF power amplifier is negligibly small and, in response to said determination, is capable of determining a scaling factor for said output samples.

14. The wireless network set forth in claim 13 wherein said processing means scales subsequently received input samples of said digital input baseband signal according to a value of said scaling factor.

15. The wireless network set forth in claim 14 wherein said processing means adjusting an amplitude of said scaled digital input baseband signal.

16. The wireless network set forth in claim 13 wherein said processing means modifies a selected subsequently received input sample according to a value of said scaling factor without regard to an amplitude of said selected subsequently received input sample.

17. For use in a wireless network comprising a plurality of base stations capable of communicating with a plurality of mobile stations, a method of operating an RF transmitter in one of the plurality of base stations, the RF transmitter comprising a transmit path capable of receiving a digital input baseband signal and generating therefrom a modulated RF output signal wherein the transmit path comprises an RF power amplifier operable to transmit the modulated RF output signal within selected limits of an adjacent channel power (ACP) profile specified for the RF transmitter, the method comprising the steps of:

capturing from the digital input baseband signal a first input sample having a first amplitude;

demodulating the modulated RF output signal to thereby produce a digital output baseband signal;

capturing a first output sample from the digital output baseband signal corresponding to the first input sample; and     determining from the input samples and the output samples if out-of-band noise signals in the RF output signal are less than the specified limits of the ACP profile by a relatively large margin;

in response to the determination, increasing an amplitude of the digital input baseband signal so as to overdrive the RF power amplifier such that the out-of-band noise signals in the RF output signal are less than the specified limits of the ACP profile by a relatively small margin.

18. The method set forth in claim 17 wherein the specified limits are specified at discrete frequency points.

19. The method set forth in claim 17 including the further step of determining if the first amplitude is sufficiently small to ensure that an amplification distortion caused by the RF power amplifier is negligibly small and, in response to the determination, determining a scaling factor for the output samples.

20. The method set forth in claim 17 including the further step of scaling subsequently received input samples of the digital input baseband signal according to a value of the scaling factor.

\* \* \* \* \*

UNITED STATES PATENT AND TRADEMARK OFFICE
CERTIFICATE OF CORRECTION

PATENT NO. : 6,693,974 B2
DATED : February 17, 2004
INVENTOR(S) : Hang Jin and Joseph R. Cleveland

It is certified that error appears in the above-identified patent and that said Letters Patent is hereby corrected as shown below:

Column 2,
Line 16, delete "s" and replace with -- is --;
Lines 18 and 19, delete "RE" and replace with -- RF --;

Column 9,
Line 26, delete "to adjust" (second occurrence).

Signed and Sealed this

Twenty-fourth Day of January, 2006

JON W. DUDAS
*Director of the United States Patent and Trademark Office*